United States Patent [19]

Suzki et al.

[11] 4,202,627
[45] May 13, 1980

[54] PHOTOELECTRIC DETECTING APPARATUS

[75] Inventors: Akiyoshi Suzki, Tokyo; Ichiro Kano; Hideki Yoshinari, both of Yokohama; Masao Tozuka, Ohmiya; Ryozo Hiraga, Yokohama; Yuzo Kato, Yokohama; Yasuo Ogino, Yokohama, all of Japan

[73] Assignee: Canon Kabushiki Kaisha, Tokyo, Japan

[21] Appl. No.: 900,856

[22] Filed: Apr. 28, 1978

[30] Foreign Application Priority Data

May 1, 1977 [JP] Japan .................................. 52-50606

[51] Int. Cl.$^2$ .................... G01K 9/08; G01B 11/00
[52] U.S. Cl. ..................................... 356/71; 250/548; 356/401; 356/446
[58] Field of Search ............... 356/71, 400, 401, 445, 356/446, 448; 250/491, 548

[56] References Cited

U.S. PATENT DOCUMENTS 4,062,623  12/1977  Suzuki et al. ...................... 356/401

FOREIGN PATENT DOCUMENTS 1168005  10/1969  United Kingdom ................. 356/210

*Primary Examiner*—Vincent P. McGraw
*Attorney, Agent, or Firm*—Fitzpatrick, Cella, Harper & Scinto

[57] ABSTRACT

An improved photoelectric detecting apparatus is disclosed in which a subject surface containing a pattern which diffracts light in a predetermined direction is scanned with spotlight and the diffracted light coming from the pattern is detected by means of photoelectric element so as to read out information of the pattern. The apparatus comprises a first photoelectric element for detecting the light diffracted in the predetermined direction, a second photoelectric element adapted for detecting light diffracted in directions other than the predetermined direction and an operational circuit for operating the signal derived from the first photoelectric element and that derived from the second one. Thus, when there is any diffractive matter such as flaw, dust and the like on the subject surface, diffracted light from the diffractive matter is detected by both the first and second photoelectric elements whereas diffracted light from the pattern is detected only by the first photoelectric element. By operating the outputs of the two photoelectric elements only the necessary information of the pattern can be read out.

3 Claims, 14 Drawing Figures

FIG. 3A
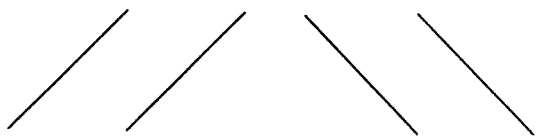
FIG. 3B
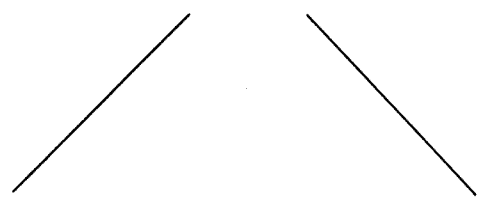
FIG. 3C
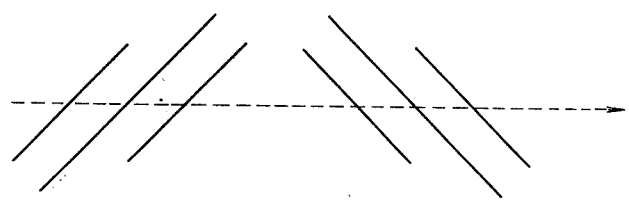
FIG. 4A  FIG. 4B
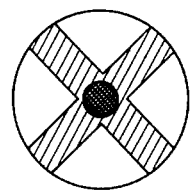 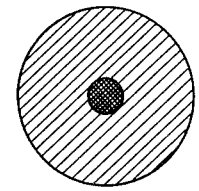

PHOTOELECTRIC DETECTING APPARATUS

BACKGROUND OF THE INVENTION

The present invention relates to a photoelectric detecting apparatus and more particularly to a photoelectric detecting apparatus with which a pattern that diffracts light in a predetermined direction can be read out without noise.

Such type of photoelectric detecting apparatus which reads out a pattern that diffracts light in a predetermined direction is the subject of our prior application, U.S. Ser. No. 790,072 assigned to the assignee of the subject application, filed on Apr. 22, 1977.

The present invention relates to an improvement of the apparatus disclosed in the above-mentioned prior patent application. The improvement made by the pesent invention resides in that the apparatus of the present invention enables reading out of a pattern that diffracts light in a predetermined direction without noise.

SUMMARY OF THE INVENTION

Accordingly, it is the primary object of the invention to provide an improved photoelectric detecting apparatus which enables read out, without noise, of a pattern that diffracts light in a predetermined direction.

To attain the object according to the invention it is proposed to detect the light diffracted in a predetermined direction by means of a first photoelectric element and also to detect, at the same time, such light diffracted in directions other than the predetermined direction by means of a second photoelectric element, and then to extract only the necessary signal corresponding to the pattern from signals of the two photoelectric elements.

When there is any foreign matter such as dust on the pattern of a subject surface, light impinging upon such dust will be diffracted not only in the predetermined direction but also in other different directions. In this case, the first photoelectric element detects both of pattern signal and dust signal whereas the second element detects only the dust signal. Making use of this dust signal of the second photoelectric element, it is possible to cancel the dust signal from the output of the first photoelectric element so as to read out only the necessary information of the pattern.

Other features, advantages and additional objects of the invention will appear more fully from the following description taken in connection with the accompanying drawings.

BRIEF DESCRIPTION OF THE DRAWINGS

FIG. 3 illustrates alignment marks of mask and wafer wherein 3(A) is an illustration of mask alignment mark, 3(B) is wafer alignment mark and 3(C) is an illustration of the two marks in a correctly aligned position;

FIG. 4 illustrates diffraction patterns on the pupil plane of the objective lens wherein 4(A) is an illustration of diffraction pattern formed by the alignment mark and 4(C) is that formed by dust;

DESCRIPTION OF THE PREFERRED EMBODIMENTS

Figure 1:
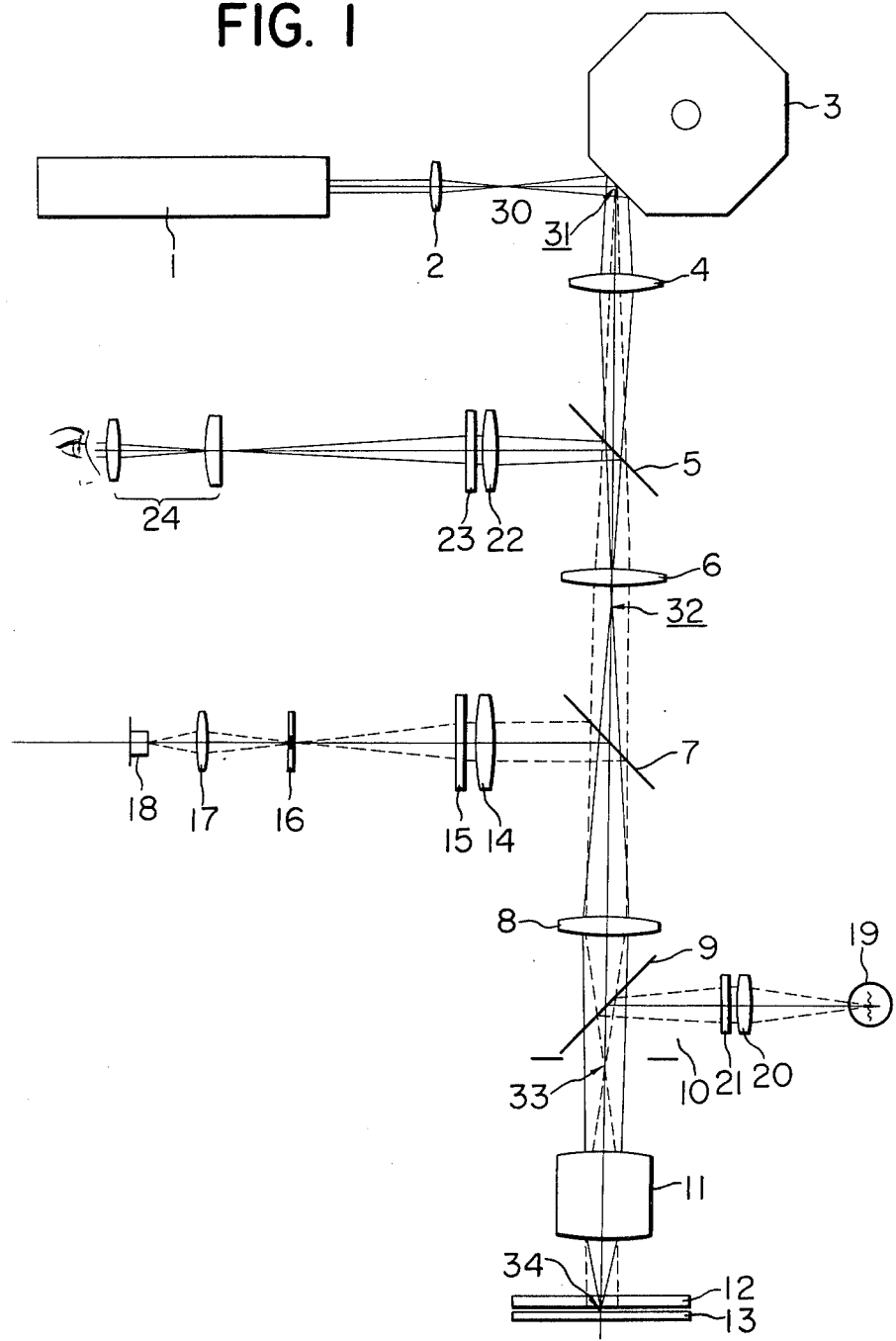
FIG. 1 schematically shows the optical system of photoelectric detecting apparatus disclosed in the abovementioned our prior application.

In FIG. 1 showing the optical system of photoelectric detecting apparatus according to our prior invention, the reference numeral 1 designates a laser light source, 2 is a condenser lens, 3 is a rotating polygonal mirror, 4 is a relay lens, 5 is a beam splitter, 6 is a field lens and 7 is a beam splitter. The beam splitter 5 divides light so as to introduce the divided light into an optical system for visual observation comprising elements designated by 22–24. The beam splitter 7 divides light so as to introduce the divided light into a photoelectric detecting optical system comprising elements designated by 14–18. Designated by 8 is a relay lens, 9 is a beam splitter for introducing light from an illumination system for visual observation designated by 19 through 21, the reference numeral 10 indicates a pupil of the objective 11, 12 is a mask and 13 is a wafer.

The conjugate relation of the laser light per se is as follows:

The laser beam emitted from the laser light source 1 is once concentrated at the position 30 by the condenser lens 2. The spot diameter of the laser beam measured at the position 30 is determined depending upon the diameter D of the laser beam incident upon the condenser lens 2 and the focal length $f_2$ of the latter. Provided that the distribution of laser light within the beam diameter D be uniform, then the spot diameter d is given by:

$$d = 2.44 \lambda (f_2 / D)$$

wherein $\lambda$ is the wavelength of the laser light.

The laser beam running divergingly from the position 30 toward the rotating polygonal mirror 3 is reflected by the latter directing the same to the relay lens 4. After passing through the relay lens, the beam is once focused at a position 32 in the vicinity of the field lens 6. Thereafter, the beam is again focused at the position 34 which lies on the surfaces of mask 12 and wafer 13 through the relay lens 8 and the objective 11. Therefore, as viewed in the drawing of FIG. 1, the positions 30, 32 and 34 are conjugate relative to each other.

The diameter $\Phi$ of the light spot 34 with which the surfaces of the mask and wafer is actually scanned is given by:

$$\Phi = ad$$

wherein a is the magnification of image forming system from 30 to 34.

Therefore, it will be understood that the diameter of the spot for scanning can be varied by changing the value of d. This may be achieved by altering the beam diameter D of the laser light or by altering the focal length $f_2$ of the lens 2. If it is desired only to enlarge the scanning spot, this may be realized in a very simple manner by intentionally displacing the condenser lens 2 and defocusing the laser light at the position 30. Generally speaking, it is desirable that suitable selection of the diameter of the scanning spot be permitted depending upon the line width of a pattern in subject. The system shown in FIG. 1 can satisfy this requirement.

The laser light spotted at the position 34 scans the surfaces of the mask and wafer as the polygonal mirror 3 rotates.

It is important to establish the above described conjugate relation as to the beam with which the subject surface is actually scanned. Another important thing is the arrangement relating to the image formation of the pupil of the optical system shown in FIG. 1. The pupil of the objective 11 is indicated by the reference numeral 10. The position 33 on the optical axis, that is, the center of the pupil, is positioned conjugate to the reflection point 31 of the rotating polygonal mirror 3. In view of the incidence of the laser beam upon the objective, the arrangement shown in FIG. 1 is regarded as equivalent to an arrangement in which the rotating polygonal mirror is positioned just at the position of the pupil 10.

To observe a reflective object such as a wafer, there is usually used a telecentric objective lens. The objective 11 shown in FIG. 1 is also telecentric for this reason. Namely, the objective 11 has the pupil 10 disposed at its front focal position by which pupil the beam passing through the optical system is determined. Since the center position 33 of the pupil 10 that is also the front focal point of the objective 11 is conjugate to the laser reflecting position 31 of the rotating polygonal mirror 3 as previously described, the position 33 has an effect as if the scanning beam is emitted from it.

The principal ray that becomes the center ray of the scanning beam passes through the front focal point 33 of the objective and therefore it becomes parallel with the optical axis after passing through the objective 11 so that it is incident upon the mask and wafer perpendicularly. If the area upon which the scanning beam falls is flat, then the beam is reflected so as to return to the position 33. On the contrary, if there is a pattern in the area upon which the scanning beam falls, then it is scattered by the edges of the boundary portion of the pattern so that the light impinging upon the subject surface can not return along the same path as it passed. When the scattered light which the objective 11 took up passes through the pupil again, the light travels not through the center 33, but through the marginal part of the pupil. This means that on the pupil plane, scattered light and non-scattered light are spatially separated.

Figure 2:
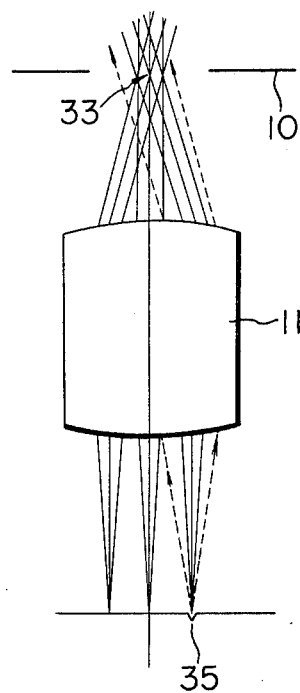
FIG. 2 is an explanatory view of the objective lens part of the optical system shown in FIG. 1.

FIG. 2 illustrates the manner of separation of scattered light from non-scattered light. When the surface of the subject is scanned, for example, from left to right by the scanning beam, the light is subjected only to reflection but not to scattering until the scanning beam impinges upon the pattern portion 35. Thus, the reflected light continues returning to the same position as it passed through, in the pupil 10. But, when the scanning beam impinges upon the pattern 35, it is scattered by the pattern and the scattered light goes back to the pupil 10 along a light path suggested by the dotted line which no longer passes through the same position as the light first passed through in the pupil. The area which the non-scattered light covers in the pupil 10 is equal to the clear aperture (diameter) of the scanning laser beam. In order to effectively take up the scattered light, the clear aperture of the non-scattered light is usually so selected as to be sufficiently small as compared with that of the pupil. A range of from 0.1 to 0.7 is generally preferable for the ratio of diameter.

Now, returning again to FIG. 1, the photoelectric detecting optical system will be described which is branched from the beam splitter 7 and reaches a photo detector 18. Designated by 14 is a lens for forming an image of the pupil 10 of the objective 11 and the reference numeral 15 designates a filter which transmits such light useful for photo-detection but cuts off light or other wavelengths such as that used in the optical system for visual observation. 16 indicates the position at which an image of the pupil 10 is formed by the lens 14. At this position there is disposed a stopper 16 which transmits only scattered light and blocks non-scattered light. The scattered light passed through the stopper enters a condenser lens 17 which condenses the scattered light. The condensed, scattered light enters the photo detector 18. The pupil 10, stopper 16 and photo detector 18 are, therefore, in a conjugate relation each other. The stopper may be manufactured easily by patterning a transparent glass substrate with metal or black paint.

The above described photoelectric detecting system has an output only when the scanning spot approaches the edge portion of the pattern. Therefore, observing the output in relation to time one can know that a pulse signal is produced when the scanning beam impinges upon the edge portion. In case that the pattern signals thus obtained are signals derived from the alignment marks of mask and wafer, man can detect the relative positional deviation between mask and wafer by means of the signals thus produced. By moving either the mask or wafer relative to the other by a driving system (not shown) in a manner such that the detected deviation may be corrected, an automatic alignment is attained.

The arrangement shown in FIG. 1 includes an illumination system 19-21 and an observation system 22-24 adapted for visual observation. 19 is a light source for illumination, 20 is a condenser lens and 21 is a filter. The condenser lens 20 serves to form an image of the light source on the pupil 10 of the objective 11. The function of the filter 21 is to cut off light of such wavelength area to which a photoresist is photosensitive. In the observation system, 22 is an erector by which an image is erected, 23 is a filter and 24 is an eye-piece. The filter cuts off laser wavelength and transmits such wavelength as are used for visual observation.

FIG. 3 illustrates some examples of mark patterns suitable for effecting scanning with a laser spot and which enables one to detect deviations in both directions of x and y for linear scanning in one direction. 3A illustrates a pattern for mask (or wafer) and 3B is a pattern useful for wafer (or mask). 3C illustrates both of the two mark patterns in an aligned position. The dotted line in FIG. 3C indicates the locus of the scanning laser beam.

A troublesome problem involved in the above described type of photoelectric detecting system is that caused by dust. In this photoelectric detecting system, scattered light is detected. If there is any foreign matter such as dust which also scatters light, on the area to be photoelectrically detected, then the system will pick up also the scattered light caused by such dust as a signal. Dust adhered to a wafer or to the interior of the scanning optical system may often be present. In particular, dust existing on wafers must always be considered. When light scattered by such matter other than the pattern is once detected, it forms a kind of false signal which is not only undesirable but also may cause an error of operation.

The present invention provides an effective solution of the above described problem. According to the present invention, optical filter means is used to exclude the undesirable, detected light derived from matters other than pattern, such as dust.

In order to make use of optical filter means for this purpose, the distribution of light observed at the position of stopper 16 of the photoelectric detecting part shown in FIG. 1 must be discussed first. In the above description, we have explained scattered light as a phenomenon of scattering caused by pattern edges. In other words, this phenomenon is nothing but a kind of diffraction phenomenon. Therefore, light is scattered in a direction dependent upon orientation of pattern.

FIG. 4A illusrates the distribution of scattered light, that is, a diffraction pattern observed at the position of the stopper when there is used an alignment mark as shown in FIG. 3. FIG. 4A shows that the scattered light extends in a direction perpendicular to the direction in which the alignment mark pattern extends. This is a matter easily explicable according to the general theory of common diffraction phenomenon.

FIG. 4B illustrates the distribution of scattered light caused by dust. As will be understood from 4B, scattered light caused by matters of irregular shape such as dust does not extend in a particular direction but extends uniformly in all the directions at the position of the stopper. In both the 4A and 4B illustrations, there is seen in the center of the circle a black point which stands for non-scattered light. The hatched area outside of the black point is the area where scattered light distributes. The circle circumscribing the area represents the clear aperture of the optical system.

The present invention makes use of the above described difference in scattering observed at the position of the stopper, between light coming from pattern portion and that coming from non-pattern portion. According to the invention, the photoelectric detecting system is divided into two parts, that is, a pattern detecting channel and a noise-scattered light detecting channel. Therefore, the apparatus of the invention is featured by the provision of a pattern detecting channel and a noise-scattered light detecting channel.

Figure 5:
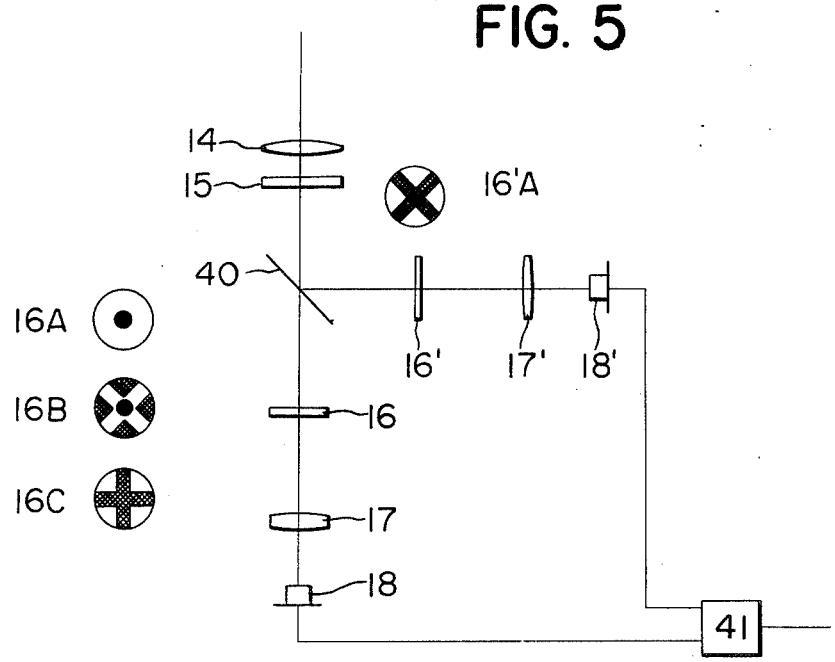
FIG. 5 schematically shows the photoelectric detecting optical system of photoelectric detecting apparatus according to the present invention.

FIG. 5 schematically shows an embodiment of such detection system according to the invention. At a position downstream of the pupil image forming lens 14, a beam of light is divided into the two channels. In the arrangement shown in FIG. 5, the system extending from the beam splitter 40 to the photo detector 18 constitutes a pattern detecting optical system which is hereinafter referred to as A channel. In this channel, namely A channel, non-scattered light is cut off and scattered light as shown in the hatched area of FIG. 4A is transmitted. For this purpose, a stopper of 16A, 16B or 16C shown in FIG. 5 may be used as the stopper 16. However, it should be noted that in A channel, detection is made also as to scattered light caused by dust which uniformly distributes on the stopper as shown in FIG. 4B, in addition to a pattern signal.

Another photoelectric detecting system branched at the position of the beam splitter 40 and extending to the photo detector 18' constitutes a noise-scattered light detecting optical system which is hereinafter referred to as B channel. This channel, namely B channel serves to detect only the light scattered by foreign matter and therefore in this channel, no signal derived from a pattern is included. To exclusively detect the light scattered by dust and the like, it is necessary to block non-scattered light and light scattered by the mark pattern as shown in the hatched area of FIG. 4A. This may be achieved, for example, by employing a stopper 16'A shown in FIG. 5, which blocks the signal of alignment mark.

In this manner, it is assured that A channel detects pattern and dust whereas B channel detects dust only. Since light introduced into A channel and light introduced into B channel is divided from the same signal light by the beam splitter, there is obtained a synchronism with respect to the signal of dust which is detected in both the A and B channels. Therefore, it becomes possible to eliminate or at least reduce the effect of dust by subtracting the output of B channel from the output of A channel (A−B). The desired output of (A−B) may be formed in a simple manner, for example, by introducing the outputs of photo detectors 18 and 18' into a differential amplifier 41. In a similar manner, the effect of dust may be minimized also by taking out the exclusive OR of the output from A and the output from B channel A⊕B. In this case, the desired output of A⊕B may be formed by introducing the outputs of the photo detectors 18 and 18' into an exclusive OR circuit the symbol ⊕ representing "exclusive OR".

FIG. 6 illustrates various modes of operation of the signal processing system according to the invention.

Figure 6A:
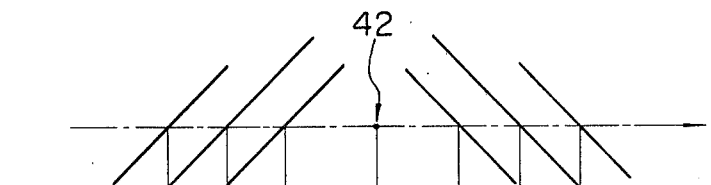
FIG. 6 shows various output curves of the photoelectric element together with the alignment marks related to the output.
Figure 6B:
Figure 6C:
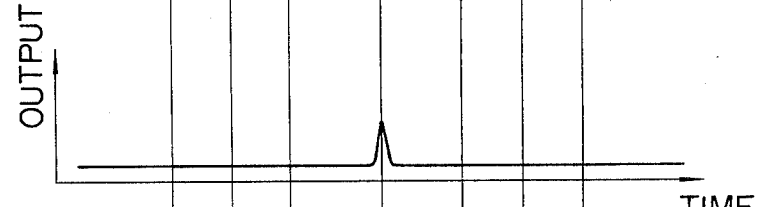

FIG. 6(a) shows the patterns of wafer and mask in the position at which the patterns have been detected by a scanning laser beam indicated by the one point chain line. The positional relation between the pattern on mask and the pattern on wafer shown in FIG. 6(a) is the same as that shown in FIG. 3C with the exception that dust 42 exists on the scanning line. FIG. 6(b) is an output curve of A channel and FIG. 6(c) is that of channel B. The difference between the output curves shown in FIGS. 6(b) and (c), respectively, is due to the fact that A channel is a channel for detecting "pattern and dust" whereas B channel is for detecting "dust". Two detectors 18 and 18' receive light beams divided from the same signal light and therefore the output derived from dust appears in A and B channels at the same time.

Figure 6D:
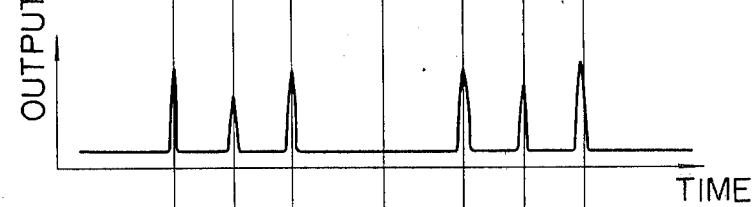
Figure 6E:
Figure 6F:

FIG. 6(d) corresponds to the case where the dust signal of A channel and the dust signal of B channel were just cancelled completely. FIG. 6(e) corresponds to the case where the dust signal of B channel was larger than that of A channel so that the former could not completely be cancelled with respect to the latter. In the case of FIG. 6(f), the dust signal of A channel was so much larger than that of B channel as not to be cancelled completely.

It depends upon various factors and can not be determined unconditionally which of the cases (d)–(f) will happen. For example, it depends upon the light scattering characteristics of dust, the ratio of transmittivity to reflecting power of the beam splitter 40 used, the manner of signal processing (one or both of the signals are multiplied by a certain magnification in differential amplification or making use of difference in sensitivity between the photo detectors) and the like. However, when the curves (d)–(f) showing the signal obtained after passed through the differential amplifier are compared with the curve (b) showing the output obtained by simply cutting scattered light only, it becomes evident that in cases of (d)–(f), noise is reduced and thereby the ratio of pattern signal S/noise N is increased accordingly.

As described above, the present invention relates to a detecting system for detecting signals whose diffraction patterns are known and the essential feature thereof resides in that two detecting channels are provided, one for detecting the signal and the other for taking up noise light other than the signal so as to form an output corresponding to the difference between the outputs of the two channels.

While the present invention has been particularly shown and described in connection with alignment of mask and wafer, it is to be understood that the invention is generally applicable for all such applications which involve processing signals whose diffraction patterns are known. For example, the present invention is also useful for defect tests of masks or for curve tracing.

We claim:
1. A photoelectric detecting apparatus comprising:
    a light source;
    a scanner for scanning an object to be tested having a pattern which diffracts light in a predetermined direction by a light beam from said light source;
    a first photoelectric detector for detecting the diffracted light in the predetermined direction coming from said test object;
    a second photoelectric detector for detecting the light diffracted in directions other than said determined direction coming from said test object; and
    an electric circuit for producing a signal corresponding to the diffracted light coming from said pattern from the outputs of said first and second photoelectric detectors.

2. A photoelectric detecting apparatus as claimed in claim 1, wherein said electric circuit produces an output corresponding to the difference between the outputs of said first and second photoelectric detectors.

3. A photoelectric detecting apparatus as claimed in claim 1, wherein said electric circuit produces an output corresponding to the excessive OR of the output of said first photoelectric detector and that of said second one.

* * * * *